United States Patent [19]

Demay et al.

[11] Patent Number: 4,813,373

[45] Date of Patent: Mar. 21, 1989

[54] CELL FOR EPITAXY BY MOLECULAR BEAMS AND ASSOCIATED PROCESS

[75] Inventors: Yves Demay, St. Cyr; Jean-Pierre Gailliard; Alain Million, both of Grenoble; Jean Piaguet, Eybens, all of France

[73] Assignee: Commissariat a l'Energie Atomique, Paris, France

[21] Appl. No.: 49,969

[22] Filed: May 15, 1987

[30] Foreign Application Priority Data

May 15, 1986 [FR] France .............................. 86 06987

[51] Int. Cl.⁴ .............................................. C23C 16/00
[52] U.S. Cl. .................................................... 118/726
[58] Field of Search ......................................... 118/726

[56] References Cited

U.S. PATENT DOCUMENTS 4,553,022  11/1985  Colombo ............................. 219/275
4,606,296  8/1986   Gailliard et al. ..................... 118/726
4,668,480  5/1987   Fusiyashu ......................... 118/726 X Primary Examiner—Bernard Pianalto
Attorney, Agent, or Firm—Oblon, Fisher Spivak, McClelland & Maier

[57] ABSTRACT

It comprises a vaporization chamber containing the material to be vaporized and provided with at least one opening with a given cross-section for maintaining the material to be vaporized in the liquid state within said chamber and for emitting controlled flow molecular beams, a sleeve integral with the vaporization chamber surrounding the opening or openings having a given cross-section, heating means for maintaining the vaporization chamber isothermal and for obtaining an adequate temperature in the sleeve to prevent condensation of the vaporized material in said sleeve and in the opening or openings having a given cross-section.

8 Claims, 3 Drawing Sheets

CELL FOR EPITAXY BY MOLECULAR BEAMS AND ASSOCIATED PROCESS

BACKGROUND OF THE INVENTION

Epitaxy by molecular beams or jets is a method for forming films of numerous materials on a substrate in ultravacuum or ultra-high vacuum. A molecular beam is obtained by producing a vapour pressure of the material in question in an enclosure or isothermal crucible having an opening.

The prior art discloses long crucibles, whose characteristics can be clearly defined. A cell of this type is relatively satisfactory when its operating temperature is sufficiently high and when the source material is in the liquid state. However, when using material supplying the necessary flux or flow by sublimation at low temperature (Te, As, P, Zn, Cd, S, Etc.), said cells suffer from the disadvantages referred to hereinafter.

Firstly, the material can condense at the mouth of the cell, bearing in mind that the latter is surrounded by liquid nitrogen-cooled panels. This condensation can extend to the plugging of the cell orifice.

The heat losses of the cell, essentially due to the radiation in ultravacuum are very small due to the low operating temperature. Therefore, if it is wished to reduce the cell temperature, a drop can only take place slowly after cutting off the heating means. Thus, there are heat regulating problems.

Moreover, it is difficult and even impossible to stove said cells, the latter operation consisting of heating the equipment to undergo epitaxy (ultravacuum enclosure and cell) to a temperature adequate for degassing the same. This operation generally takes place at a temperature of approximately 200° to 250° C., which can be adequate for emptying the cell charged or filled with a volatile material.

In addition, these cells do not make it possible to obtain stable flows from solid materials due to the inherent emission instability of a solid. This is due to the fact that the temperature of the material is not uniform. The material displaces, deforms and evaporates in puffs. To this is added the disadvantage of having projections of solid particles. Furthermore, the flow cannot be reproduced over a period of time due to the reduction of the charge.

Moreover, the diameter of the outlet ports used for such cells is sufficiently large to permit the entry of molecules from other cells, which are reflected by the furnace, by the substrate, or have not been trapped by the cooled surrouding panels. The interaction of these molecules with the charge of the cell can modify the evaporation level at a given temperature either by doping the source, or by forming a new compound on the surface of the charge, which leads to a variation of the emission surface and forms another cause of instability.

Finally, the inevitable degassing of the heating element is a by no means negligible source of pollution to the ultravacuum enclosure, the substrates to be coated and consequently the deposited products.

SUMMARY OF THE INVENTION

The invention specifically relates to a cell for epitaxy by molecular beams obviating these disadvantages. According to the invention, a cell for epitaxy by molecular beams having a vaporization chamber for containing a material to be vaporized, in which the material has at its melting point a vapour pressure exceeding $10^{-2}$ Pa, said vaporization chamber having an opening for emitting molecular beams of said material and heating means for keeping isothermal the vaporization chamber. The chamber is equipped with a single opening or several openings with a given cross-section. The cross-section of the opening or openings is determined in such a way as to obtain a flux or flow with the desired intensity, the material to be vaporized being in the liquid state within the vaporization chamber.

Preferably, a thermal sleeve integral with the vaporization chamber surrounds the opening or openings having a given cross-section, said sleeve projecting beyond the opening or openings and has heating means making it possible to obtain at said opening or openings a temperature adequate to prevent the condensation of the vaporized material passing through said openings.

Epitaxy by molecular beam is understood to mean epitaxy in the strict sense, or a deposition without epitaxial relation with the substrate.

The general formula linking the flow leaving a cell containing a gas with the pressure P and emitting in the vacuum with the section S of the opening through which it occurs, assuming that said opening is perforated in thin wall form is approximately as follows:

$$J = (2\pi MkT)^{-\frac{1}{2}} PS \qquad (1)$$

(ignoring the adiabatic expansion corrections) and with:
 J = flow,
 M = molecular mass of the evaporated species,
 k = Boltzmann constant,
 T = absolution temperature in the cell above the melting point of the material,
 P = pressure in the cell linked with the temperature T thereof by a law in the form:

$$\text{Log } P = (A/T) + B$$

A and B being characteristic constants of the evaporated material.

If it is wished to obtain an incident flux F on a substrate located at a distance L from the opening, it is necessary for $J = ML^2 F$ (approximation of the Lambert law), so that:

$$s = \frac{(2\pi^3 MkT)^{\frac{1}{2}} L^2 F}{P}$$

Thus, the order of magnitude of the passage cross-section of the opening (the sum of the cross-sections of the openings) is determined by the formula:

$$s = \frac{(2\pi^3 MkT)^{\frac{1}{2}} L^2 F}{P}$$

In particular, the diameter of the outlet opening is $\leq 1$ mm.

Preferably, the cell has a second wall formed by turning by 180° the wall of the thermal sleeve, a space being left free between the outer wall of the cell and the outer wall of the thermal sleeve on the one hand, and the inner wall of the second wall on the other, said heating means being located in said space.

The assembly constituting the cell (vaporization chamber, sleeve and heating means) is fixed to a fixing flange ensuring the desired positioning of each element.

According to a preferred embodiment, the vaporization chamber and the sleeve are constituted wholly or partly by a double envelope.

In a first variant of this embodiment only the inner wall of the double envelope is held by the fixing flange. This arrangement makes it possible to reduce the risks of pollution of the ultravacuum enclosure by forming a screen with respect to the degassing products of the heating element not directly facing the substrate on which epitaxy takes place.

In a second variant of this embodiment, only the outer wall of the double envelope is fastened to the fixing flange. This arrangement defines an enclosure in which the heating element is perfectly insulated from the ultravacuum enclosure and can be, independently, placed under atmospheric conditions, a controlled atmosphere, or under vacuum.

Preferably, the heating means are constituted by a lamellar resistor, placed within the double envelope and forming at its two ends a higher resistance than in its central part.

The invention has the following advantages. As the material is brought into the vaporization chamber in the liquid state, it is stirred up by convection currents which make its temperature much more uniform than mere conduction in a solid which sublimates. Consequently, due to the good temperature uniformity, the flow stability is better.

The intensity of the flow is limited and consequently controlled by the cross-section of the opening or openings of the vaporization chamber and by the pressure prevailing within the cell. It is independent of the liquid level and consequently remains constant during the epitaxy operation, whereas in the case of the prior art long crucible, the intensity of the flow is dependent on the position of the level of the evaporation surface of the solid or liquid material with respect to the outlet port and consequently continuously varies. Moreover, the pressure within the vaporization chamber is greater than that of the ultravacuum enclosure (in a ratio of approximately $10^4$), so that the flow intensity is independent of the pressure in said ultravacuum enclosure.

The heated sleeve surrounding the opening or openings of the vaporization chamber eliminates the risks of the blocking thereof.

Moreover, projections of solid particles and return pollution are eliminated, because the cross-section of the vaporization chamber opening is 10,000 times smaller than that of standard cells. It has also been experimentally proved that a cell according to the invention has an angular emission similar to that of Knudsen cells in the useful zone.

In the case where the cell has a plurality of openings, this makes it possible to direct beams in different directions and cover substrates with large surfaces.

Finally, the double envelope of the cell forms a screen or shield with respect to the degassing products of the heating element, which no longer directly faces the substrate on which epitaxy takes place. The degassing products evacuated rearwards are pumped or trapped by adjacent cooled panels, thus limiting the pollution and/or doping of the layer or film deposited.

In another variant, the double envelope is integral with the fixing flange maintaining the cell on the ultravacuum enclosure, the heating element then being entirely isolated or insulated from the ultravacuum enclosure and pollution risks are avoided. This flange can be equipped with an opening making it possible to place the heating element under vacuum or controlled atmospheric conditions.

The present invention also relates to a process for the formation of a molecular beam of a material for application to beam epitaxy, said material having at its melting point a vapour pressure exceeding $10^{-2}$ Pa, in which the material to be vaporized is brought in the liquid state into a vaporization chamber having at least one opening with a given diameter and surrounded by a sleeve, the temperature of the vaporization chamber being kept isothermal and that of the sleeve adequate to prevent the condensation of the material in the latter and in the opening of the vaporization chamber.

Preferably, the process in which it is desired to obtain an incident flow F on a substrate located at a distance L from the outlet port of the vaporization chamber is characterized in that the flux J leaving the cell is determined by the formula $J = ML^2F$, an absolute operating temperature T of the cell exceeding the melting point $T_F$ of the material is chosen and both cell and sleeve are brought to said temperature T and an order of magnitude of the passage cross-section S of the flow through the outlet port or ports of the vaporization chamber is determined by the formula:

$$S = \frac{(2\pi^3 MkT)^{\frac{1}{2}} L^2 F}{P}$$

in which S designates the total cross-section of the port or ports.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
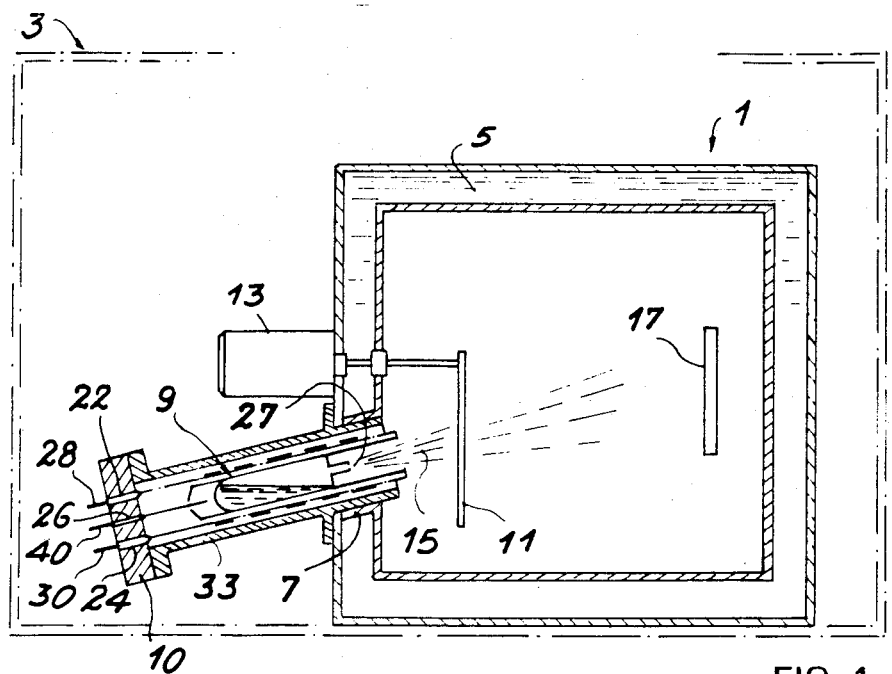
FIG. 1 An overall view of an ultravacuum enclosure containing a substrate and having a cell for epitaxy according to the invention.

Molecular beam epitaxy is a method permitting the preparation of films of numerous materials. In vacuum deposition methods of a product by epitaxy using molecular beams on a substrate to be covered, as shown in FIG. 1, use is made of an ultravacuum enclosure 1, e.g. maintained at a pressure of $10^{-9}$ Torr and cooled by a heat shield constituted by a peripheral layer of a gas liquefied at low temperature, e.g. nitrogen. Enclosure 1 has at least one circular opening associated with an envelope 33 into which is introduced a cell for molecular beam epitaxy and designated by reference numeral 9.

As will be seen, said cell contains all or part of the products to be deposited maintained at the necessary temperature, which exceeds the melting point, by heating means surrounding said cell. A fixing flange 10 ensures the sealing of the cell 9 and maintains all the elements of said cell within envelope 33. It is provided with tight passages 22, 24, 26 for supplying current and the thermocouple. An obscurable screen 11 can be rotated by an external control means 13 constituted e.g. by an electric motor. When screen 11 is obscured, beam 15 produced by the cell reaches the substrate 17 to be coated and located within enclosure 1.

FIG. 1 shows an ultravacuum enclosure with a single molecular beam epitaxy cell. However, it is obvious that a plurality of such cells can be provided for equipping said enclosure.

Figure 2:
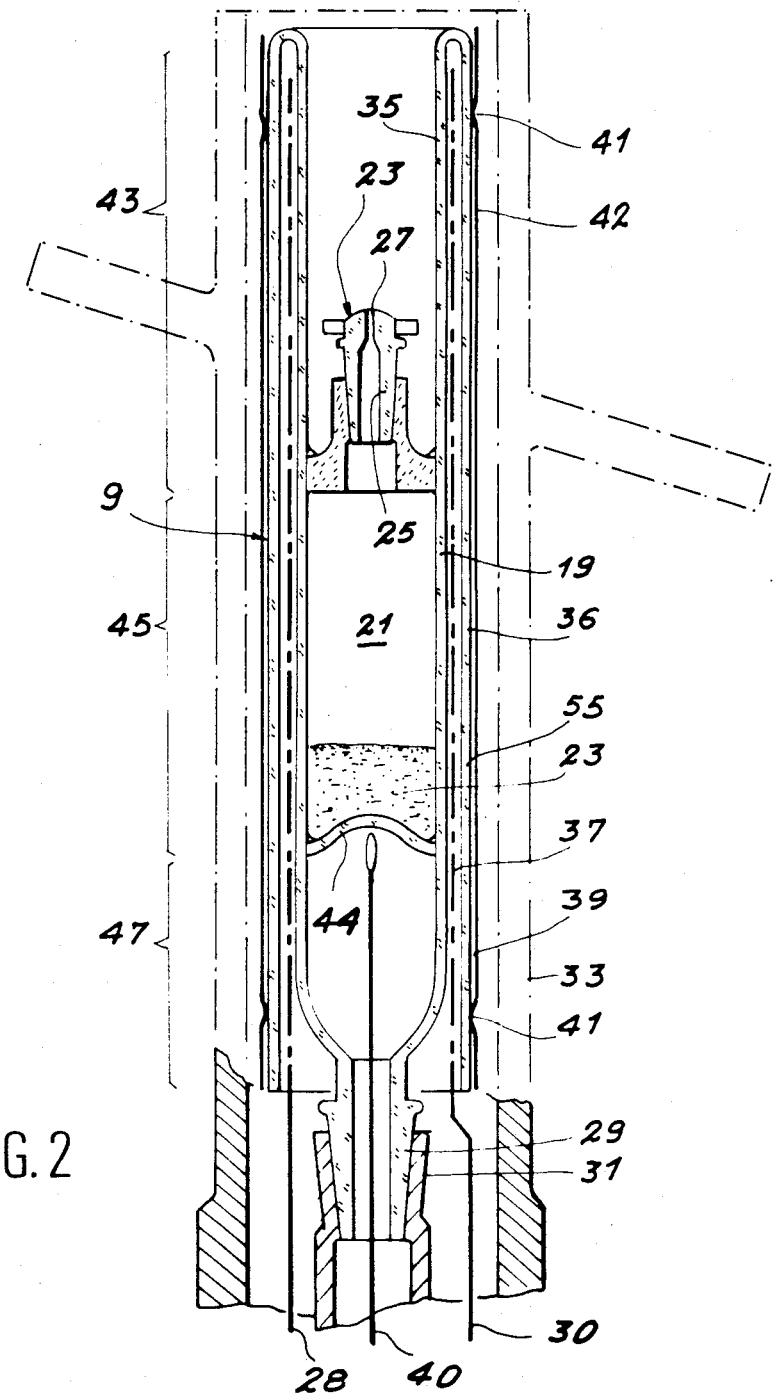
FIG. 2 A larger scale view of the epitaxy cell shown in FIG. 1.

FIG. 2 shows on a larger scale a molecular beam epitaxy cell according to the invention forming part of the assembly shown in FIG. 1. The body of cell 19 is constituted by a quartz envelope defining a vaporization chamber 21 containing the product 23, whereof a molecular beam is to be obtained. Chamber 21 is sealed by a plug 25 with a small diameter opening 27, calculated in the manner indicated hereinbefore, so as to keep liquid the material to be vaporized and obtain control flow molecular beams (typical value $10^{13}$ to $10^{15}$ molecules per $cm^2$ and per second on the substrate).

In its lower part, the body of cell 19 is provided with a cone 29 engaged in a corresponding ground joint extending a quartz support 31, which is itself integral with a fixing flange, not shown in FIG. 2, but which is shown at 10 in FIG. 1. Said flange has tight passages 22, 24, 26 for the supply of electric current 28, 30 and for thermocouple 40.

The wall of the cell body is extended beyond plug 25 by a sleeve 35, whose internal diameter is equal to the internal diameter of chamber 21, although this is not obligatory. A double envelope 55 is made e.g. by turning by 180° the wall of sleeve 35, within which are located heating means, preferably constituted by an electric resistor 37 supplied by two electric conductors 28, 30. This permits self-supporting of resistor 37 and prevents the degassing products of the resistor from being directly in front of the substrate in the enclosure (epitaxy taking place on said substrate), thereby reducing the pollution and/or doping of the film which is deposited. The degassing products are discharged rearwards of cell 19 so as to be pumped or trapped by adjacent cooled panels. A preferred embodiment of electric resistor 37 will be described relative to FIG. 3.

A metal sheet 42, e.g. of tantalum, wound around the body of cell 19 constitutes a thermal insulation limiting heat exchanges between the cell body brought to a relatively high temperature and the liquefied gas layer surrounding enclosure 1. It should be noted that the tantalum sheet 42 only rests on envelope 19 by a few studs 41 located at each of its ends, so as to define a free space between said sheet and the envelope, so as to improve the thermal insulation of the cell.

The body of cell 19 is consequently constituted by three zones, respectively an upper zone 43 in which the sleeve 35 is located, an intermediate zone 45 corresponding to chamber 21 containing the product to be vaporized and a lower zone 47 constituted by the part of the cell body extending from the lower wall 44 of chamber 21 up to the start of fixing cone 29. The heating means 37 located between the outer wall of the cell body and back surface 36 supply different heat quantities to each of these three zones, as will be shown relative to FIG. 3.

Figure 3:
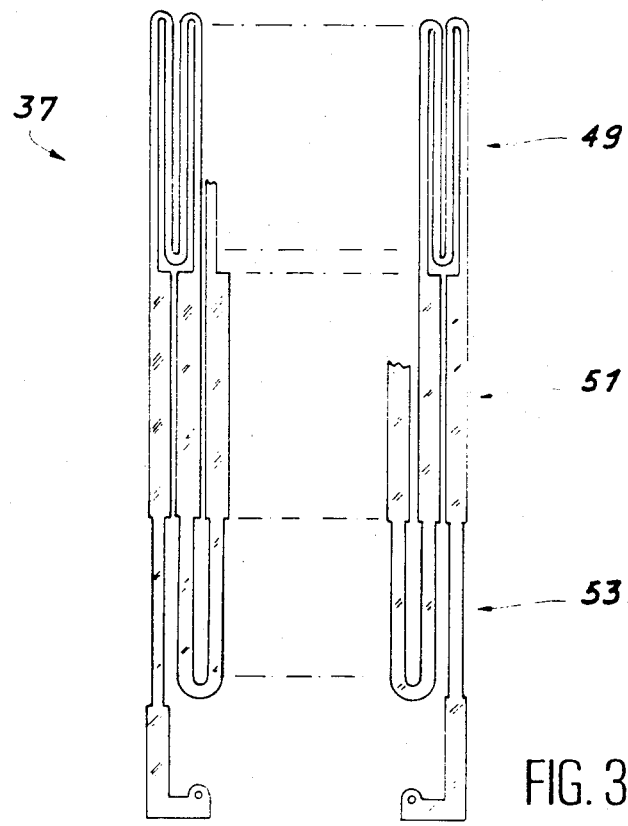
FIG. 3 A developed view of a preferred heating means for the cell of FIG. 2.

FIG. 3 shows a preferred embodiment of the heating means making it possible to heat the product to be deposited.

These heating means 37 are constituted by an electric conductor obtained by cutting, e.g. a thin tantalum sheet by electro-erosion. It is formed from three zones, namely an upper zone 49 according to FIG. 3, an intermediate zone 51 and a lower zone 53. These three zones correspond to zones 43, 45, 47 respectively of cell 19. The cross-section of the conductor is smallest in the upper zone 49 and then in lower zone 53. The conductor has a relatively large cross-section in intermediate zone 39. The electrical resistance of the conductor increases when its section decreases, so that the heating obtained by the Joule effect is greatest in the upper zone 49 and in the lower zone 53, so as to prevent cooling of the ends of the cell body. Thus, the cell is heated in an isothermal manner. The upper part 49 constitutes the heating resistor of the heated sleeve making it possible to avoid condensation problems on leaving the cell. The heating power levels of zones 49, 51 and 53 can be chosen within wide construction-based limits.

Figure 4:
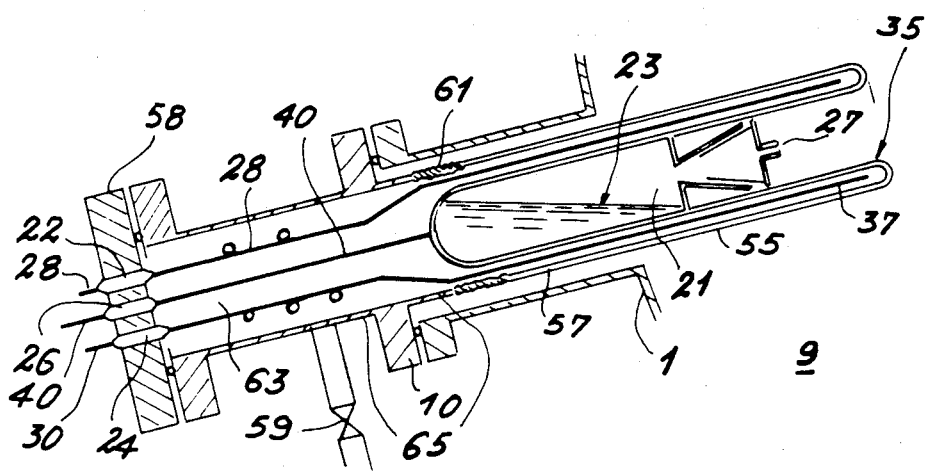
FIG. 4 The diagrammatic view of the cell according to the invention equipped with a double envelope integral with the fixing flange.

FIG. 4 shows another variant of the invention. A double envelope 55 is e.g. obtained by turning by 180° the wall of sleeve 35 extended by a portion 57, so as to be joined to the fixing flange 10 by any means ensuring ultravacuum sealing. In FIG. 4, reference 61 represents a quartz-metal weld fastening sleeve 35, double envelope 55 and portion 57, which are here made from quartz, to the fixing flange 10, which is here made from metal. Heating element 37 is consequently insulated from ultravacuum enclosure 1, which is protected from any pollution caused by the degassing of heating element 37. The sealing flange 58 which, together with fixing flange 10, defines an enclosure 63, has the tight passages 22, 24, 26 necessary for the electric current supplies 28, 30 and the thermocouple 40. At least one valve 59 makes it possible to independently place heating element 37 under vacuum or controlled atmospheric conditions. The materials used for producing the cell, as well as the geometry of the latter can be of a random nature.

Two examples of the invention will be given hereinafter.

EXAMPLE I

Material to be deposited: tellurium (evaporation in the form of $Te_2$), M=255.2. The melting temperature of tellurium is 722.5 K., so that e.g. a cell operating temperature T of 733 K. is chosen, at which pressure of $Te_2$ is approximately P=0.8 Torr. If the substrate is placed at a distance L=10 cm from the cell and if it is wished to use a flow F=$10^{14}$ molecules per $cm^2$ and per second (typical value used in molecular beam epitaxy), we obtain:

$$S = 4.99 \times 10^{-4} \, cm^2 = 499 \times 10^4 \, \mu m^2$$

For a cylindrical hole, the diameter must be equal to 252 $\mu$m.

EXAMPLE II

Material to be deposited: cadmium (Cd), M=112.4, T=623 K., P=0.29 Torr, F-$10^{14}$ molecules per $cm^2$ and per second, L=10 cm:

$$S = 8.20 \times 10^{-4} \, cm^2$$

$$S = 820 \times 10^4 \, \mu m^2$$

For a cylindrical hole, the diameter must be equal to approximately 323 $\mu$m.

What is claimed is:

1. A cell for molecular beam epitaxy having a vaporization chamber for containing a material to be vaporized, said material having at its melting point a vapor pressure exceeding $10^{-2}$ Pa, said vaporization chamber being provided with an opening for the emission of the molecular beams of said material and heating means for keeping the vaporization chamber isothermal, wherein the chamber is provided with a single opening or a plurality of openings of given cross-section, wherein the cross-section of the opening or openings is determined in such a way as to obtain a flow of desired intensity, the material to be vaporized being in the liquid state within the vaporization chamber, wherein a thermal sleeve integral with the vaporization chamber surrounds the opening or openings of given cross-section, said sleeve projecting beyond the opening or openings and having heating means making it possible to obtain at the sleeve a temperature adequate for preventing the condensation of the vaporized material passing through said openings, and wherein a second wall is formed by turning by 180° the wall of the thermal sleeve, a space being left free between the outer wall of the cell and the outer wall of the thermal sleeve on the one hand and the inner wall of the second wall on the other, said heating means being located in said space, said heating means being constituted by a lamellar resistor, formed from three zones, including an upper zone, an intermediate zone and a lower zone, said upper zone of said resistor surrounding said thermal sleeve, said intermediate zone of said resistor surrounding said vaporization chamber and said lower zone of said resistor surrounding a part of the cell body extending from a lower wall of the vaporization chamber up to a fixing means, said resistor having a cross section larger in said intermediate zone than in said lower zone, and a cross section larger in said lower zone than in said upper zone so as to heat the cell in an isothermal manner.

2. A cell according to claim 1, wherein the order of magnitude of the passage cross-section of the opening (the sum of the cross-section of the openings) is determined by the formula:

$$S = \frac{(2\pi^3 MkT)^{\frac{1}{2}} L^2 F}{P}$$

in which M is the molecular mass of the material, k is the Boltzmann constant, T is the absolute temperature higher than the melting point of the material prevailing within the cell, L the distance separating the opening or openings from the substrate, F the incident flow which it is wished to obtain on the substrate and P the pressure in the cell at the absolute temperature T.

3. A cell according to claim 1, wherein the diameter of the opening or openings is $\leq 1$ mm.

4. A cell according to claim 1, wherein the cell, the thermal sleeve, the second wall and a portion extending the wall are made from quartz.

5. A cell according to claim 1, wherein the wall of the cell is held by a fixing flange.

6. A cell according to claim 1, wherein the second wall is connected by a weld to a sealed fixing ferrule, the latter being integral with a flange which can be sealingly mounted on a vacuum enclosure, said ferrule defining with the internal volume between the outer walls of the vaporization chamber and the thermal sleeve on the one hand and the inner wall of the second wall on the other, a tight enclosure in which the heating element is entirely contained.

7. A cell according to claim 6, wherein the heating means are constituted by a lamellar resistor placed within the tight enclosure and forming at its two ends a higher resistance than in its central part.

8. A cell according to claim 7, wherein the lamellar resistor is constituted by a cut metal sheet having an upper zone around the thermal sleeve, an intermediate zone around the cell and a lower zone, the cross-section of the resistor being smaller in the lower and upper zones than in the intermediate zone.

* * * * *